United States Patent
Kim

(10) Patent No.: US 6,724,226 B2
(45) Date of Patent: Apr. 20, 2004

(54) SIGNAL TRANSMISSION CIRCUIT CAPABLE OF TOLERATING HIGH-VOLTAGE INPUT SIGNAL

(75) Inventor: Dae-gyu Kim, Kunpo (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/094,916

(22) Filed: Mar. 7, 2002

(65) Prior Publication Data

US 2003/0001629 A1 Jan. 2, 2003

(30) Foreign Application Priority Data

Jun. 29, 2001 (KR) ......................................... 2001-38146

(51) Int. Cl.[7] .............................. H03B 1/00; H03K 3/00
(52) U.S. Cl. ......................... 327/108; 327/391; 326/81
(58) Field of Search ................................ 327/108, 112, 327/205, 206, 170, 333, 379, 389, 391, 427; 326/26, 27, 81, 83

(56) References Cited

U.S. PATENT DOCUMENTS

| | | | | |
|---|---|---|---|---|
| 5,576,635 A | * | 11/1996 | Partovi et al. ................. | 326/27 |
| 5,892,377 A | * | 4/1999 | Johnston et al. ............. | 327/108 |
| 6,057,717 A | * | 5/2000 | Kawano et al. .............. | 327/112 |
| 6,124,733 A | * | 9/2000 | Sharpe-Geisler ............. | 326/83 |

* cited by examiner

Primary Examiner—Long Nguyen
(74) Attorney, Agent, or Firm—Mills & Onello LLP

(57) ABSTRACT

A signal transmission circuit, which is capable of improving DC characteristics, delay characteristics, and linearity in a voltage region and maintaining tolerant functions, is provided. The signal transmission circuit includes a first transmission circuit, a second transmission circuit, an inverting circuit, a first switching circuit, and a second switching circuit. The first transmission circuit transmits a signal of a first node to a second node, and the second transmission circuit transmits the signal of the first node to the second node. The inverting circuit inverts the signal of the second node, and the first switching circuit pulls down a third node in response to an output signal of the inverting circuit. The second switching circuit transmits the signal of the first node to the third node, and the second transmission circuit is controlled in response to the signal of the third node. Preferably, a second supply voltage is generated in a voltage generation circuit, a first supply voltage is greater than the second supply voltage, the inverting circuit is a Schmitt trigger, and the signal transmission circuit is a tolerant input buffer.

4 Claims, 4 Drawing Sheets

SIGNAL TRANSMISSION CIRCUIT CAPABLE OF TOLERATING HIGH-VOLTAGE INPUT SIGNAL

BACKGROUND OF THE INVENTION

1. Field of the Invention

The present invention relates to integrated circuits, and more particularly, to an input buffer capable of tolerating high input voltage.

2. Description of the Related Art

In general, an input buffer responds to a signal having a predetermined voltage level, e.g., a transistor—transistor logic (TTL) signal, converts the signal into a signal having a predetermined different voltage level, e.g., a complementary metal oxide semiconductor (CMOS) signal, and supplies the converted signal to an internal circuit of an integrated circuit (IC). An input buffer is connected to an input pad of an IC.

A signal externally applied to the input pad of an IC may not be a signal that is appropriate for normal operation of the IC. In a case where an external device electrically connected to an input pad of an IC having a voltage higher than a supply voltage used in the IC, the input buffer must also operate with a voltage higher than the supply voltage used in the IC.

In a case where a supply voltage of 5V, 3.3V, 2.5V and 1.8V is supplied to an IC, a buffer which is driven by an input signal having a voltage higher than the supply voltage of the IC is referred to as a tolerant input buffer.

In general, in a case where a supply voltage of 3.3V, or 2.5V is used, the highest tolerable input signal is 5V. In a case where a supply voltage of 1.8V is used, a highest tolerable input signal is 3.3V.

FIG. 1 illustrates a conventional tolerant input buffer circuit. Referring to FIG. 1, the tolerant input buffer includes a pad 1, a resistor R1, a path transistor T1, a Schmitt trigger 3, and an inverter 5. An input signal IN is input to the pad 1, and the resistor R1 restricts current flowing to the drain of the path transistor T1.

The pass transistor T1 is implemented by a NMOS transistor and transmits a signal smaller than a supply voltage Vdd1 for the input signal IN greater than the supply voltage Vdd1 (e.g., 3.3V) applied to the gate to a node n1. That is, in a case where the input signal IN is greater than the supply voltage Vdd1, the path transistor T1 transmits a signal whose voltage is lowered to a threshold voltage (hereinafter referred to as 'Vth') of the NMOS transistor from the supply voltage Vdd1, to the node n1.

The path transistor T1 may cut off at a voltage lower than an input logic high voltage (VIH) of the Schmitt trigger 3 due to the threshold voltage Vth increased by a body effect. As a result, when designing a VIH, in the worst case, the node n1 becomes a floating node, and thus, the input buffer is driven by a voltage generated by leakage current in a sub-threshold region, and the VIH is indicated as a higher value, thereby affecting sizing of the input buffer.

For example, if the input signal IN is linearly increased from 0V to 3.3V at the pad 1, an ideal tolerant input buffer of 5V must transmit the signal of 0V~3.3V to the node n1. However, referring to FIGS. 4 and 5, the conventional tolerant input buffer is cut off by the threshold voltage of the path transistor T1 at the point of 2.2V, and thus, a DC/AC voltage Vn1 transmitted to the node n1 gradually increases from the point of 2.2V and loses its linearity. This problem occurs in an analog tolerant input circuit such as a comparator and an amplifier.

Further, since the path transistor T1 is cut off before the VIH of the Schmitt trigger 3, the input voltage of the Schmitt trigger 3 is increased by leakage current of the path transistor T1 until reaching a transition voltage of the Schmitt trigger 3, and thus, it takes a long time to reach the transition voltage of the Schmitt trigger 3. As a result, propagation delay increases.

SUMMARY OF THE INVENTION

To solve the above problems, it is an object of the present invention to provide a signal transmission circuit that is capable of improving DC characteristics, delay characteristics, and linearity in a voltage region and of maintaining tolerant functions.

According to an embodiment of the present invention, there is provided a signal transmission circuit. The signal transmission circuit includes a first transmission circuit for transmitting a signal of a first node to a second node, a second transmission circuit for transmitting the signal of the first node to the second node, an inverting circuit for inverting the signal of the second node, a first switching circuit for pulling down a third node in response to an output signal of the inverting circuit, and a second switching circuit for transmitting the signal of the first node to the third node. The second transmission circuit is controlled in response to the signal of the third node.

According to another embodiment of the present invention, there is provided a signal transmission circuit. The signal transmission circuit includes a first transmission circuit for transmitting a signal of a first node to a second node, a second transmission circuit for transmitting the signal of the first node to the second node, a transition control circuit for controlling transition from a first state to a second state, or from the second state to the first state, in response to an output signal of the second node, a first switching circuit for pulling down a third node in response to an output signal of the transition control circuit, and a second switching circuit for transmitting the signal of the first node to the third node. The second transmission circuit is controlled in response to the signal of the third node.

In one embodiment, the first transmission circuit is an NMOS transistor, a first supply voltage is input to the gate of the NMOS transistor, a first end of the NMOS transistor is connected to the first node, and a second end of the NMOS transistor is connected to the second node. The second transmission circuit can be a PMOS transistor, a gate of the PMOS transistor being connected to the third node, a first end of the PMOS transistor being connected to the first node, and a second end of the PMOS transistor being connected to the second node.

The first switching circuit can include an NMOS transistor, an output signal of the inverting circuit can be input to the gate of the NMOS transistor, a first end of the NMOS transistor being connected to the ground voltage, and a second end of the NMOS transistor being connected to the third node. The second switching circuit can be a PMOS transistor, a second supply voltage can be input to the gate of the PMOS transistor, a first end of the PMOS transistor can be connected to the first node, and a second end of the PMOS transistor can be connected to the third node.

Preferably, the second supply voltage is generated in a voltage generation circuit, and the first supply voltage is greater than the second supply voltage, the inverting circuit is a Schmitt trigger, and the signal transmission circuit is a tolerant input buffer.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will be described more fully hereinafter with reference to the accompanying drawings in which preferred embodiments of the invention are shown.

Figure 2:
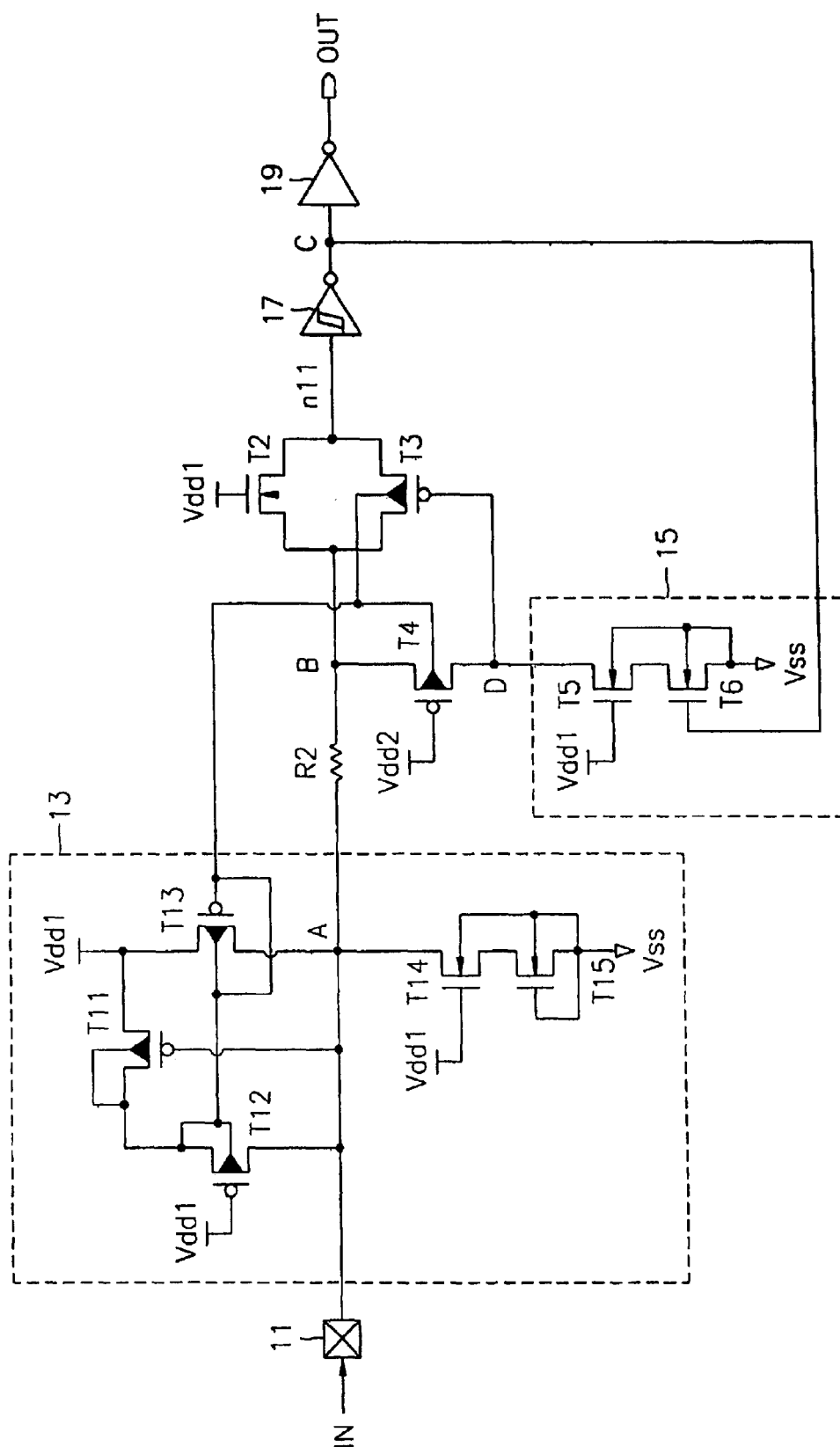
FIG. 2 illustrates a tolerant input buffer circuit according to an embodiment of the present invention.

FIG. 2 illustrates a tolerant input buffer circuit according to an embodiment of the present invention. Referring to FIG. 2, the tolerant input buffer is one of signal transmission circuits implemented in a semiconductor integrated circuit and includes a first transmission circuit T2, a second transmission circuit T3, a first inverting circuit 17, a first switching circuit 15, and a second switching circuit T4.

The tolerant input buffer may further include an electrostatic discharge (ESD) protection circuit 13 and a second inverting circuit 19.

The ESD protection circuit 13 protects an internal circuit of a semiconductor memory device from ESD applied from outside of the semiconductor memory device and is installed in a pad of a chip in order to prevent discharge from an external pin from applied ESD.

When ESD is applied to an input pin 11, the ESD protection circuit 13 causes a punch-through phenomenon, thereby sending high current caused by ESD to the ground voltage Vss and protecting the internal circuit of the memory device. That is, in a case where a very high voltage is induced to the drains of MOS transistors T12, T13, and T14, punch-through occurs in the MOS transistors T12, T13, or T14.

The ESD protection circuit 13 includes a plurality of transistors T11 through T15. The source of the transistor T11 is connected to a first supply voltage Vdd1 (e.g., 3.3V), and the gate thereof is connected to a node A. The gate of the transistor T12 is connected to the first supply voltage Vdd1, the drain thereof is connected to the node A, and the source and substrate thereof are connected to the drain and substrate of the transistor T11.

The source of the transistor T13 is connected to the first supply voltage Vdd1, and the substrate and gate thereof are connected to the source and substrate of the transistor T12, the substrate of the transistor T4 and the substrate of the transistor T3, and the drain thereof is connected to the node A.

The gate of the transistor T14 is connected to the first supply voltage Vdd1, the drain thereof is connected to the node A, and the substrate thereof is connected to the ground voltage Vss. The gate, source, and substrate of the transistor T15 are connected to the ground voltage Vss, and the drain thereof is connected to the source of the transistor T14.

A resistor R2 connected between the node A and a node B, transmits an input signal IN input to a pad 11 from the node A to the node B and restricts current flowing from the node A to the node B.

Preferably, in a case where the supply voltage of the semiconductor memory device is 3.3V or 2.5V, the tolerant input buffer tolerates the input signal IN from 0V to 5V. Preferably, in a case where the supply voltage of the semiconductor memory device is 1.8V, the tolerant input buffer tolerates an input signal IN from 0V to 3.3V.

The first transmission circuit T2 transmits a signal of the node B to a node n11. The first transmission circuit T2 is an NMOS transistor. The gate of the NMOS transistor is connected to the first supply voltage Vdd1, the drain thereof is connected to the node B, and the source thereof is connected to the node n11, and a predetermined substrate voltage (e.g., negative voltage) is supplied to the substrate thereof. The first supply voltage Vdd1 may be 3.3V, 2.5V, or 1.8V, but in the illustrative embodiment of FIG. 2, the first supply voltage Vdd1 is 3.3V.

That is, in a case where the voltage of the node B is greater than 3.3V, the maximum voltage transmitted to the node n11 corresponds to a voltage drop from the first supply voltage Vdd1 of 3.3V to a threshold voltage (hereinafter referred to as 'Vth') of the first transmission circuit T2.

For example, assuming that 3.3V is supplied to the gate of the first transmission circuit T2 and the threshold voltage Vth of the first transmission circuit T2 is 0.7V, the maximum voltage transmitted to the node n11 is 2.6V. However, considering a body effect of the first transmission circuit T2, the maximum voltage transmitted to the node n11 may be smaller than 2.6V.

The second transmission circuit T3 transmits the signal of the node B to the 26 node n11. The second transmission circuit T3 is a PMOS transistor. The gate of the PMOS transistor T3 is connected to a node D, and the source thereof is connected to the node B, and the drain thereof is connected to the node n11, and a predetermined substrate voltage (e.g., positive voltage) is supplied to the substrate thereof.

The second transmission circuit T3 transmits the signal of the node B to the node n11 in response to the amplitude of the signal of the node B and the amplitude of the signal of the node D. That is, the second transmission circuit T3 is turned on and transmits the signal of the node B to the node n11 only if the signal of the node B is greater in amplitude than the signal of the node D and greater than the threshold voltage Vth of the second transmission circuit T3.

The first inverting circuit 17 inverts the signal of the node n11 and outputs the inverted signal to a node C. A Schmitt trigger is used as the first inverting circuit 17.

The first switching circuit 15 pulls down the node D in a case where the signal of the node C is logic 'high'. The first switching circuit 15 includes NMOS transistors T5 and T6. The gate of the NMOS transistor T5 is connected to the first supply voltage Vdd1, the drain thereof is connected to the node D, and the substrate thereof is connected to the ground voltage Vss. The gate of the NMOS transistor T6 is connected to the node C, and the source and substrate thereof are connected to the ground voltage Vss, and the drain thereof is connected to the source of the NMOS transistor T5.

However, the first switching circuit 15 may include only the transistor T6, the drain thereof being connected to the node D, the gate thereof being connected to the node C, and the source and substrate thereof being connected to the ground voltage Vss.

The second switching circuit T4 transmits the signal of the node B to the node D. The second switching circuit T4 is a PMOS transistor. The gate of the PMOS transistor is connected to a second supply voltage Vdd2, the source thereof is connected to the node B, and the drain thereof is connected to the node D. Here, in this illustrative embodiment, the second supply voltage Vdd2 is 2.5V. However, the second supply voltage Vdd2 may be a voltage other than 2.5V.

Preferably, the first supply voltage Vdd1 is greater than the second supply voltage Vdd2. The second inverting circuit 19 inverts the signal of the node C and outputs an output signal OUT to a predetermined internal circuit (not shown).

Figure 3:
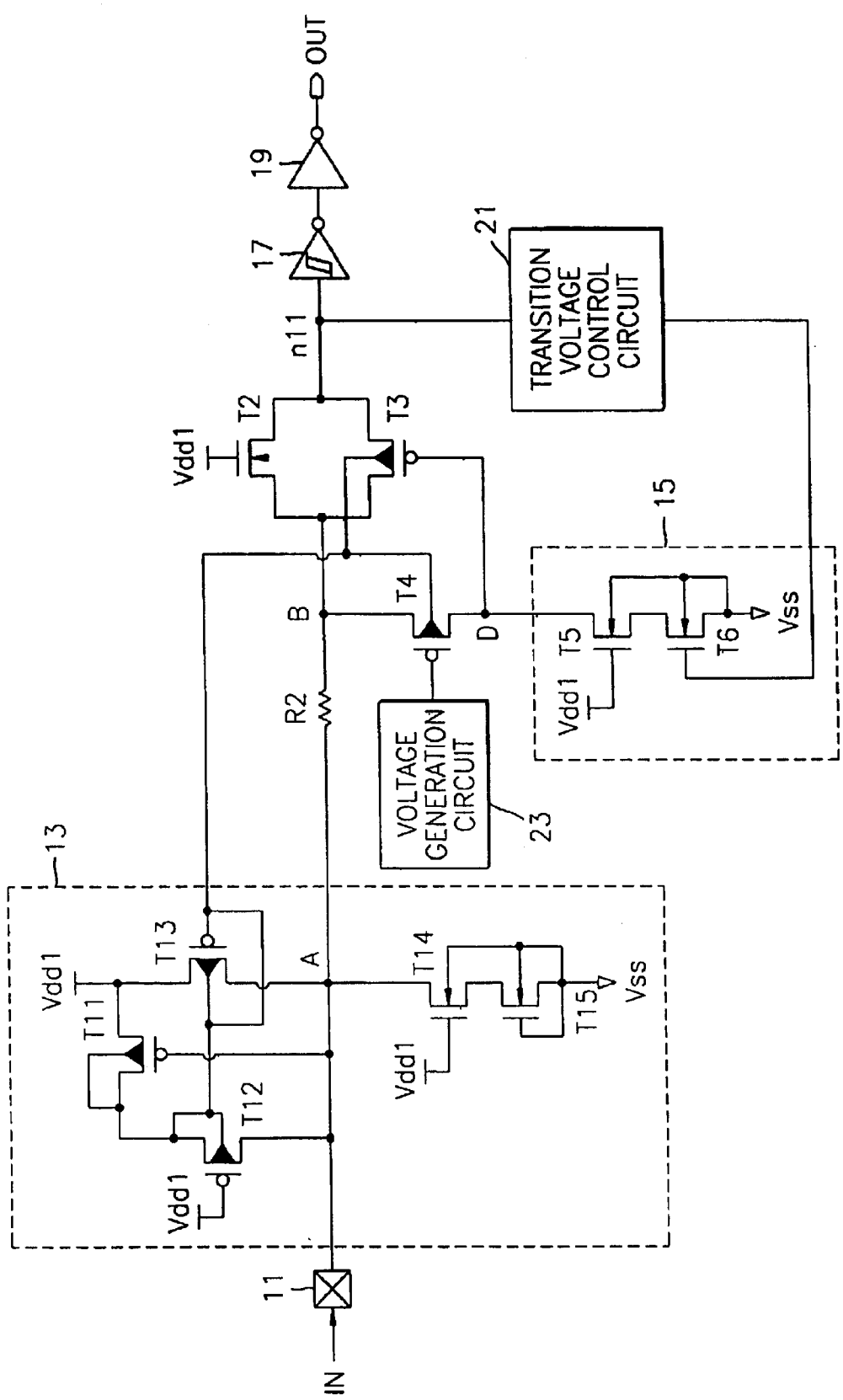
FIG. 3 illustrates a tolerant input buffer circuit according to another embodiment of the present invention.

FIG. 3 illustrates a tolerant input buffer circuit according to another embodiment of the present invention. Referring to FIG. 3, the tolerant input buffer, as one of signal transmission circuits, includes a first transmission circuit T2, a second transmission circuit T3, a first inverting circuit 17, a first switching circuit 15, a second switching circuit T4, a voltage generation circuit 23, and a transition voltage control circuit 21.

The tolerant input buffer may further include an electrostatic discharge (ESD) protection circuit 13 and a second inverting circuit 19 having the same structure as FIG. 2. The basic operation of the tolerant input buffer of FIG. 3 is similar to the tolerant input buffer of FIG. 2. Thus, detailed descriptions related to only the voltage generation circuit 23 and the transition voltage control circuit 21 are included as below.

The transition voltage control circuit 21 is connected between the node n11 and the first switching circuit 15. The transition voltage control circuit 21 may include a voltage comparator. According to the state of the signal of the node n11, logic 'high' is transitioned to logic 'low', or logic 'low' is transitioned to logic 'high'.

That is, the transition voltage control circuit 21 may control an input logic low voltage (VIL) or an input logic high voltage (VIH) of the first switching circuit 15. For example, the transition voltage control circuit 21 recognizes the case where the signal of the node n11 is 3V, as the VIH, thereby turning on the NMOS transistor T6 of the first switching circuit 15.

Further, the transition voltage control circuit 21 recognized a case where the signal of the node n11 is 2V, as the VIH, thereby turning on the NMOS transistor T6 of the first switching circuit 15.

The voltage generation circuit 23 supplies a predetermined signal to the gate of the second switching circuit T4, thereby controlling the operation of the second switching circuit T4. That is, the second switching circuit T4 transmits the signal of the node B to the node D in response to the output signal of the voltage generation circuit 23 supplied to the gate.

For example, assuming that the output signal of the voltage generation circuit 23 is 2.5V, and the threshold voltage Vth of the second switching circuit T4 is 0.8V, the second switching circuit T4 is turned on and transmits the signal of the node B to the node D in a case where a signal greater than 3.3V is input to the node B.

Further, assuming that the output signal of the voltage generation circuit 23 is 1.8V and the threshold voltage Vth of the second switching circuit T4 is 0.8V, the second switching circuit T4 is turned on and transmits the signal of the node B to the node D in a case where a signal greater than 2.6V is input to the node B.

In a case where the output signal of the voltage generation circuit 23 increases, the amplitude of the signal of the node B turning on the second switching circuit T4 increases. However, in a case where the output signal of the voltage generation circuit 23 decreases, the amplitude of the signal of the node B turning on the second switching circuit T4 decreases.

Since switching of the second switching circuit T4 is controlled by the output signal of the voltage generation circuit 23, switching of the second transmission circuit T3 may be controlled. Thus, a signal transmitted from the node B to the node n11 may be controlled by switching of the second transmission circuit T3.

Figure 1:
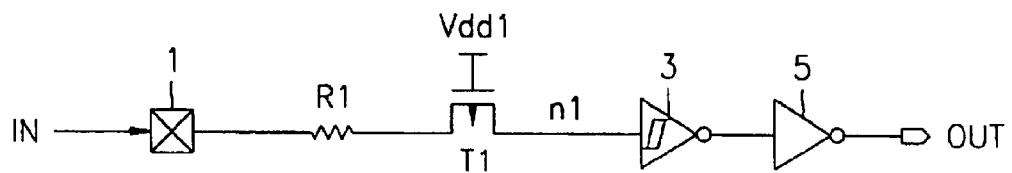
FIG. 1 illustrates a conventional tolerant input buffer circuit.
Figure 4:
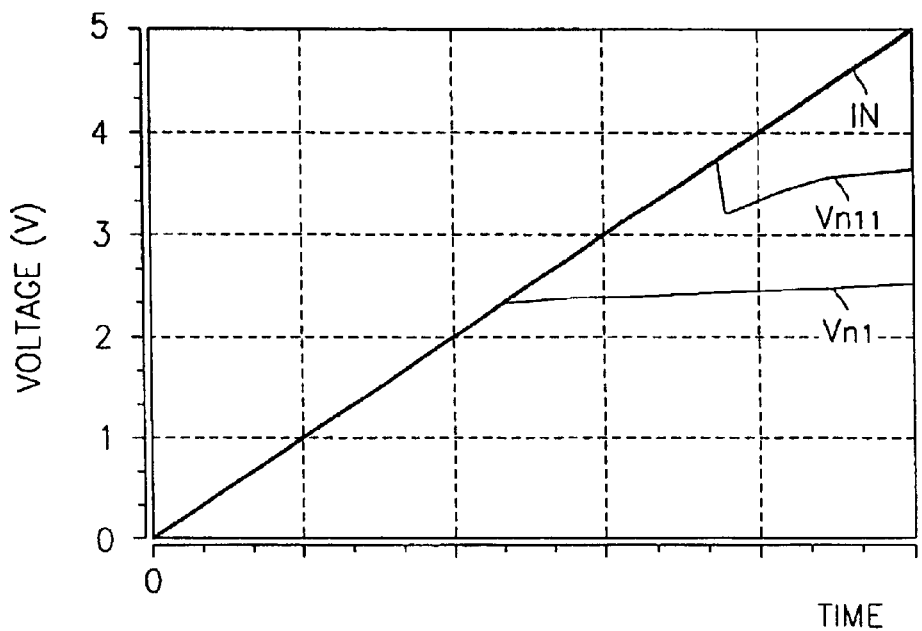
FIG. 4 illustrates the comparison of DC voltage characteristics of the conventional tolerant input buffer circuit with the tolerant input buffer circuit according to the embodiments of the present invention.

FIG. 4 illustrates the comparison of DC voltage characteristics of the conventional tolerant input buffer circuit with the tolerant input buffer circuit according to the embodiments of the present invention. Referring to FIGS. 1, 2, and 4, IN denotes a signal input to a pad 1 or 11, Vn1 denotes a DC voltage of a node n1, and Vn11 denotes a DC voltage of the node n11.

In the conventional tolerant input buffer, in a case where the voltage of the input signal IN is linearly increased to 2.2V, the voltage transmitted to the node n1 is linearly increased. However, in a case where the voltage of the input signal IN is greater than 2.2V, the first transmission circuit T2 (FIGS. 2 & 3) is cut off, and the voltage transmitted to the node n1 is not linearly increased, and is gradually increased according to the leakage current of the first transmission circuit T2.

However, in the tolerant input buffer according to the embodiments of the present invention, even if the input signal IN is increased to 3.7V, the voltage transmitted to the node n11 through the second transmission circuit T3 is linearly increased. In a case where the input signal IN is greater than 3.7V, the second transmission circuit T3 is cut off and is gradually increased by leakage current of the first and second transmission circuits T2 and T3.

Figure 5:
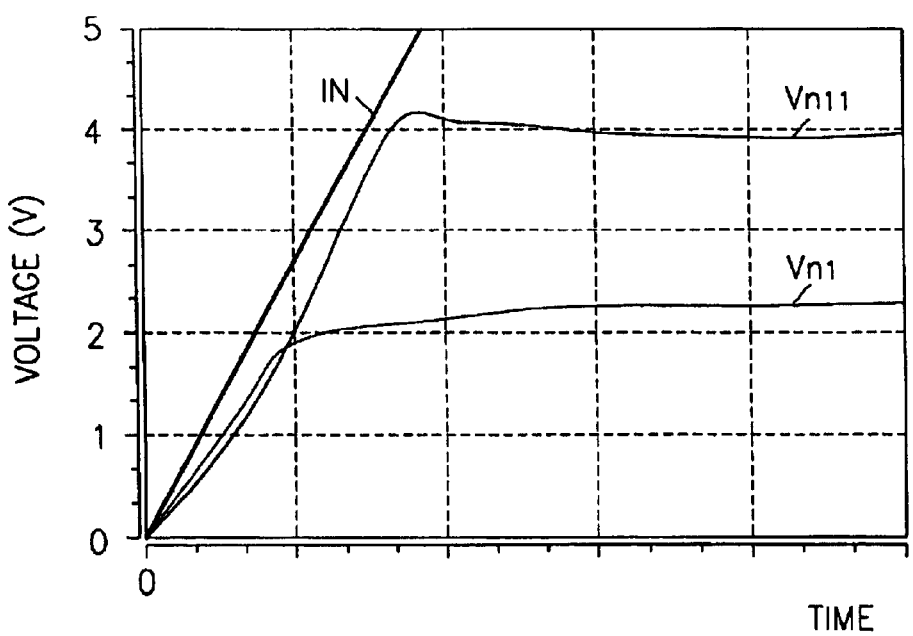
FIG. 5 illustrates the comparison of AC voltage characteristics of the conventional tolerant input buffer circuit with the tolerant input buffer circuit according to the embodiments of the present invention.

FIG. 5 illustrates a comparison of AC voltage characteristics of the conventional tolerant input buffer circuit with the tolerant input buffer circuit according to the embodiments of the present invention. Referring to FIGS. 1, 2, and 5, IN denotes a signal input to a pad 1 or 11, Vn1 denotes an AC voltage of a node n1, and Vn11 denotes an AC voltage of the node n11.

In a case where the input signal IN of the tolerant input buffer according to the present invention is increased from 0V to 4V, the voltage of the node n11 is linearly increased to 4V and is maintained at 4V. Vn11 shown in FIG. 5 is higher than Vn11 shown in FIG. 4 because of capacitance of the second transmission circuit T3.

With reference to FIGS. 2, 4, and 5, in a case where the first supply voltage Vdd1 is 3.3V, and the second supply voltage Vdd2 is 2.5V, if the input signal IN of 0V is input to the input pad 11, the first transmission circuit T2 is turned on and transmits the signal of the node B of 0V to the node n11.

The Schmitt trigger 17 inverts the node n11 and outputs 'high' to the node C. The NMOS transistor T6 is turned on in response to the 'high' level at node C, and thus, the node D is pulled down to the ground voltage Vss.

Since the voltage of 0V is applied to the gate of the second transmission circuit T3 in the state where 0V is input to the node B, the second transmission circuit T3 is turned off. In such a case, the second switching circuit T4 is turned off.

Next, if the input signal IN increased to 1V is input to the input pad 11, the first transmission circuit T2 transmits the signal of 1V to the node n11. The first inverting circuit 17 is not transitioned to 'high' in response to the signal transmitted to the node n11, and thus, the output of the node C is maintained at 'high'.

Accordingly, the first switching circuit 15 is turned on and pulls down the node D, and thus, 0V is applied to the gate of the second transmission circuit T3.

Accordingly, if a voltage higher than the threshold voltage Vth of the second transmission circuit T3 is input to the node B, that is, to the source of the second transmission circuit T3, and 0V is applied to the gate of the second transmission circuit T3, the second transmission circuit T3 is turned on and transmits the input signal IN of 1V to the node n11. The first transmission circuit T2 is turned on, but the second switching circuit T4 is turned off.

Further, if the input signal IN, which is increased, e.g., to 2.2V, is input to the input pad 11, the threshold voltage Vth of the first transmission circuit T2 is increased due to a body effect of the first transmission circuit T2, and thus, the threshold voltage Vth of the first transmission circuit T2 is increased to a level greater than the voltage of the gate and source of the first transmission circuit T2, and the first transmission circuit T2 is turned off.

However, the first inverting circuit 17 is not transitioned from 'high' to 'low' and still outputs 'high' to the node C. Thus, the node D is pulled down to the ground voltage Vss, and the second transmission circuit T3 is turned on.

That is, the input signal IN input to the source of the second transmission circuit T3 is 2.2V, and a signal input to the gate of the second transmission circuit T3 is 0V, and thus, the second transmission circuit T3 is turned on and transmits the signal of the node B to the node n11. Thus, the input signal IN of 2.2V is transmitted to the node n11. In such a case, the second switching circuit T4 is turned off.

If the input signal IN (e.g., greater than 2.2V) is input to the input pad 11, the inverting circuit 17 outputs 'low' to the node C in response to the signal of the node n11 greater than the VIH. Thus, the NMOS transistor T6 of the first switching circuit 15 is turned off, and the node D is floated.

At this time, the voltage of the node D increases, but the voltage of the node D is maintained at a predetermined voltage (e.g., about 1V) due to leakage current of the NMOS transistors T5 and T6. Thus, the second transmission circuit T3 is still turned on and transmits the signal of the node B to the node n11. The second switching circuit T4 is still turned off.

In a case where the input signal IN of 3.6V is input to the input pad 11, and a signal corresponding to the input signal IN is input to the node B, considering a body effect of the second switching circuit T4, the signal transmitted to the source (node B) of the second switching circuit T4 is greater than the sum of the signal supplied to the gate of the second switching circuit T4 and the threshold voltage Vth of the second switching circuit T4, and thus, the second switching circuit T4 is turned on.

Accordingly, the signal of the node B is transmitted to the node D, and thus, the second transmission circuit T3 is turned off.

Further, if the input signal IN greater than 3.6V is input to the input pad 11, the first and second transmission circuits T2 and T3 are turned off. The tolerant input buffer is stable even if the input signal IN greater than a tolerant voltage is transmitted to the node B.

For example, the input signal IN from 0V to 1V is transmitted to the node n11 through the first transmission circuit T2, and the input signal IN from 1V to 2.2V is transmitted to the node n11 through the first and second transmission circuits T2 and T3, and the input signal IN from 2.2V to 3.6V is transmitted to the node n11 through the second transmission circuit T3. The input signal IN greater than 3.6V is not transmitted to the node n11 because the first and second transmission circuits T2 and T3 are cut off.

The numerical values are used only to illustrate the operation of the signal transmission circuit, for example, the tolerant input buffer according to the embodiments of the present invention.

Accordingly, the tolerant input buffer according to the present invention shows voltage linearity even for an input signal greater than the conventional tolerant input buffer, thereby facilitating design of circuits with stable DC voltage and improved delay characteristics. Further, since voltage linearity is improved, the voltage linearity may be effectively used in an analog tolerant input buffer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A signal transmission circuit comprising:

a first transmission circuit for transmitting a signal of a first node to a second node, the first transmission circuit being a first NMOS transistor, a first supply voltage being input to the gate of the first NMOS transistor, a first end of the first NMOS transistor being connected to the first node, and a second end of the first NMOS transistor being connected to the second node;

a second transmission circuit for transmitting the signal of the first node to the second node;

an inverting circuit for inverting the signal of the second node;

a first switching circuit for pulling down a third node in response to an output signal of the inverting circuit; and a second switching circuit for transmitting the signal of the first node to the third node;

wherein the second transmission circuit is controlled in response to the signal of the third node;

wherein the second transmission circuit is a first PMOS transistor, a gate of the first PMOS transistor is connected to the third node, a first end of the first PMOS transistor is connected to the first node, and a second end of the first PMOS transistor is connected to the second node;

wherein the first switching circuit includes a second NMOS transistor, an output signal of the inverting circuit is input to the gate of the second NMOS transistor, a first end of the second NMOS transistor is connected to the ground voltage, and a second end of the second NMOS transistor is connected to the third node;

wherein the second switching circuit is a second PMOS transistor, a second supply voltage is input to the gate of the second PMOS transistor, a first end of the second PMOS transistor is connected to the first node, and a second end of the second PMOS transistor is connected to the third node; and wherein the first and second supply voltages are not equal.

2. The signal transmission circuit as claimed in claim 1, wherein the second supply voltage is generated in a voltage generation circuit, and the first supply voltage is greater than the second supply voltage.

3. The signal transmission circuit as claimed in claim 1, wherein the signal transmission circuit is a tolerant input buffer.

4. The signal transmission circuit as claimed in claim 1, wherein the inverting circuit is a Schmitt trigger.

* * * * *